(12) United States Patent
Woo

(10) Patent No.: US 10,497,588 B2
(45) Date of Patent: Dec. 3, 2019

(54) EFEM, EQUIPMENT FRONT END MODULE

(71) Applicant: Bum Je Woo, Seongnam (KR)

(72) Inventor: Bum Je Woo, Seongnam (KR)

( * ) Notice: Subject to any disclaimer, the term of this patent is extended or adjusted under 35 U.S.C. 154(b) by 84 days.

(21) Appl. No.: 15/933,261

(22) Filed: Mar. 22, 2018

(65) Prior Publication Data

US 2019/0287822 A1 Sep. 19, 2019

(30) Foreign Application Priority Data

Mar. 14, 2018 (KR) .................. 10-2018-0029501

(51) Int. Cl.
| | |
|---|---|
| *H01L 21/67* | (2006.01) |
| *B08B 17/02* | (2006.01) |
| *C23C 16/54* | (2006.01) |
| *C23C 16/40* | (2006.01) |
| *H01L 21/673* | (2006.01) |

(52) U.S. Cl.
CPC ...... *H01L 21/67017* (2013.01); *B08B 17/025* (2013.01); *H01L 21/67389* (2013.01)

(58) Field of Classification Search
CPC . C23C 16/54; C23C 16/45551; C23C 16/545; C23C 16/4401; H01L 21/6719; H01L 21/67196; H01L 21/67201; H01L 21/67173; H01L 21/67184; H01L 21/6776; H01L 21/67161; H01L 21/67017; H01L 21/67389; B08B 17/025
USPC ........................ 118/719; 156/345.31, 345.32
See application file for complete search history.

(56) References Cited

U.S. PATENT DOCUMENTS

2005/0103440 A1* 5/2005 Sato .................. H01J 37/32623
156/345.29

FOREIGN PATENT DOCUMENTS

JP 4344593 B2 10/2009

* cited by examiner

*Primary Examiner* — Rudy Zervigon

(57) ABSTRACT

The present invention relates to an equipment front end module (EFEM) configured to perform wafer transfer between process equipment and a wafer storage device that stores wafers. More particularly, the present invention relates to an equipment front end module (EFEM), in which harmful substances such as fumes, etc. are prevented from accumulating on an exhaust unit to maintain cleanness in a wafer transfer chamber at a high level, thus preventing contamination in the wafer transfer chamber.

8 Claims, 10 Drawing Sheets

EFEM, EQUIPMENT FRONT END MODULE

CROSS REFERENCE TO RELATED APPLICATION

The present application claims priority to Korean Patent Application No. 10-2018-0029501, filed Mar. 14, 2018, the entire contents of which is incorporated herein for all purposes by this reference.

BACKGROUND OF THE INVENTION

Field of the Invention

The present invention relates to an equipment front end module (EFEM) configured to perform wafer transfer between process equipment and a wafer storage device that stores wafers.

Description of the Related Art

As well known in the art, wafers are processed in a clean room in a semiconductor manufacturing process in order to improve yield and quality. However, as devices have become more highly integrated, circuits have become finer, and wafers have become larger, maintaining cleanness in the entire clean room has become difficult from both a technical and cost point of view.

Therefore, in recent years, the cleanliness only in a local space around wafers has been managed. For this purpose, a module called equipment front end module (EFEM) has been used for storing wafers in a sealed storage pod called a front-opening unified pod (FOUP), and performing wafer transfer between the FOUP and process equipment that processes the wafers.

Such an EFEM is configured such that a wafer transfer chamber provided with a wafer transfer device is provided, and a load port to which the FOUP is coupled is connected to a first surface of the wafer transfer chamber, and the process equipment is connected to a second surface of the wafer transfer chamber. Accordingly, the wafer transfer device transfers wafers stored in the FOUP to the process equipment and transfers the wafers having been processed in the process equipment into the wafer storage device.

It is noted that Japanese Patent No. 4344593 (hereinafter referred to as Patent Document 1) discloses regarding this EFEM.

An EFEM (mini environment) disclosed in Patent Document 1 includes a sealed mini environment chamber, a fan filter unit (FFU) installed on the top of the mini environment chamber and provided with an inlet into which nitrogen or argon gas is injected, a transporter installed in the mini environment chamber and transporting wafers, a first partition installed below a transfer arm of the transporter and having a plurality of openings, a second partition positioned under the first partition, and a circulation passage communicating with a space formed between the first and second partitions and circulating nitrogen or argon gas into the fan filter unit.

In the EFEM of Patent Document 1 having the above-described configuration, gas delivered from the fan filter unit flows between the first and second partitions through the openings of the first partition, and then circulates to the circulation passage.

However, in the case of Patent Document 1, the first partition has a planar shape, so that fumes on wafers may accumulate and remain on the first partition.

Thus, when gas is delivered in the form of down flow and circulated in the mini environment chamber, residual fumes having accumulated and remained on the first partition may float in the mini environment chamber, causing contamination and damage to wafers and equipment in the mini environment chamber.

The foregoing is intended merely to aid in the understanding of the background of the present invention, and is not intended to mean that the present invention falls in the purview of the related art that is already known to those skilled in the art.

DOCUMENTS OF RELATED ART (Patent document 1) Japanese Patent No. 4344593

SUMMARY OF THE INVENTION

Accordingly, the present invention has been made keeping in mind the above problems occurring in the related art, and the present invention provides an equipment front end module (EFEM), in which harmful substances such as fumes, etc. are prevented from accumulating on an exhaust unit to maintain cleanness in a wafer transfer chamber at a high level, thus preventing contamination in the wafer transfer chamber.

In order to achieve the above object, according to one aspect of the present invention, there is provided an equipment front end module (EFEM), the EFEM including: a wafer transfer chamber in which wafer transfer is performed between a wafer storage device and process equipment; and a delivery unit delivering gases into the wafer transfer chamber; and an exhaust unit exhausting the gases in the wafer transfer chamber, wherein the exhaust unit includes an exhaust plate provided with a plurality of exhaust holes, and an upper surface of the exhaust plate has a streamlined shape being convex downwardly of the wafer transfer chamber.

Further, the streamlined shape may be convex downwardly of the wafer transfer chamber based on a center of the exhaust plate.

Further, the exhaust plate may be provided with a plurality of inclined portions each communicating with an upper portion of each of the plurality of the exhaust holes, and the plurality of inclined portions may be configured such that a diameter thereof gradually decreases downwardly of the exhaust plate and have a streamlined shape being convex downwardly of the exhaust plate.

Further, the exhaust plate may be provided with a partition wall partitioning the plurality of exhaust holes such that each exhaust hole is separated from another.

Further, an upper portion of the partition wall may have a streamlined shape being convex downwardly of the wafer transfer chamber.

The exhaust unit may further include: an exhaust duct arranged at a lower portion of the exhaust plate and communicating with the plurality of exhaust holes, and the exhaust duct may be provided in plural and divide an exhaust region of the exhaust plate into a plurality of exhaust regions.

Further, the plurality of exhaust ducts may be composed of: a central exhaust duct communicating with the exhaust holes of exhaust holes positioned in a central region of the exhaust plate; a front exhaust duct communicating with the exhaust holes of the plurality of exhaust holes positioned in a front region of the exhaust plate; a rear exhaust duct communicating with the exhaust holes of the plurality of exhaust holes positioned in a rear region of the exhaust plate;

a left exhaust duct communicating with the exhaust holes of the plurality of exhaust holes positioned in a left region of the exhaust plate; and a right exhaust duct communicating with the exhaust holes of the plurality of exhaust holes positioned in a right region of the exhaust plate, and the front, rear, left, and right exhaust ducts may be positioned around the central exhaust duct.

The exhaust unit may further include: a collecting box communicating with the central, front, rear, left, and right exhaust ducts.

According to the EFEM of the present invention as described above, the following effects can be obtained.

The upper surface of the exhaust plate is formed to be convex downwardly of the wafer transfer chamber, so that unlike an EFEM in the related art, it is possible to prevent harmful substances such as fumes, etc. from accumulating and remaining on the upper surface of the exhaust plate.

The upper surface shape of the exhaust plate has a streamlined shape, whereby it is possible to effectively prevent a vortex from being generated when gases delivered from the delivery unit is exhausted to the exhaust unit. Thus, the down flow famed when the gases delivered from the delivery unit flow from the delivery unit to the exhaust plate can be a laminar flow rather than turbulent flow, whereby delivery and exhaust of the gases in the wafer transfer chamber can be efficiently maintained.

The inclined portions having a streamlined shape being convex downwardly of the exhaust plate communicate with the upper portions of the exhaust holes, so that gases in the wafer transfer chamber can be easily guided to flow to the exhaust holes. Thus, it possible to effectively prevent harmful substances such as fumes, etc. from remaining on the exhaust plate.

The plurality of exhaust holes are individually partitioned by the partition walls, so that down flow in the wafer transfer chamber can be guided to efficiently flow to the respective exhaust holes.

The exhaust plate is composed of the plurality of exhaust plates combined together, so that the exhaust plate having a streamlined shape can be easy to manufacture and have an advantage in terms of maintenance.

Due to the exhaust plate, the exhaust duct, the exhaust passage, and the collecting box of the exhaust unit that have the above-described configurations, an exhaust region of the exhaust plate can be divided into a plurality of exhaust regions. Thus, it is possible to effectively prevent generation of a dead region where no exhaust is performed.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Figure 1:
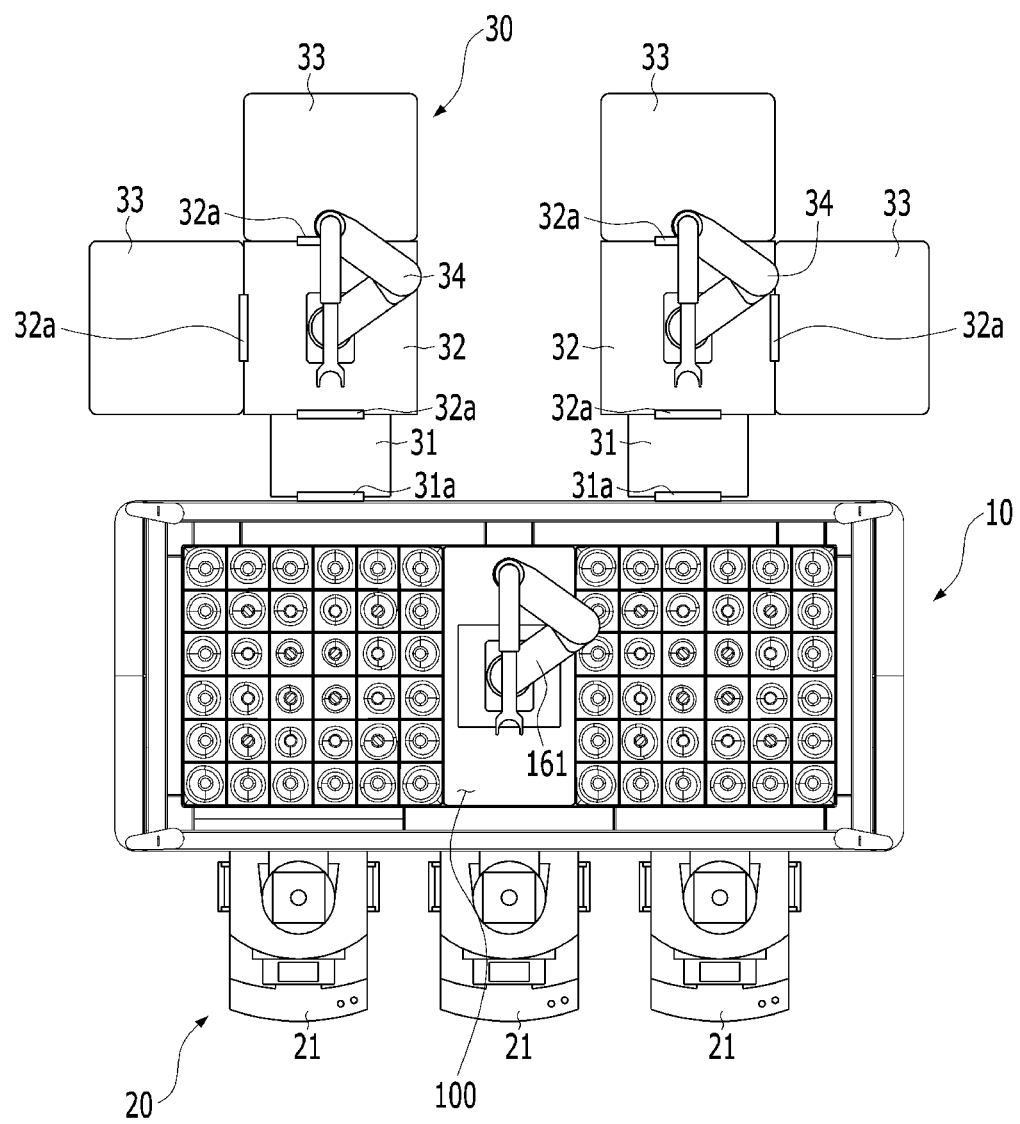
FIG. 1 is a plan view showing a state in which process equipment is connected to an EFEM according to a preferred embodiment of the present invention.

Hereinbelow, exemplary embodiments of the present invention will be described in detail with reference to the accompanying drawings. Throughout the drawings, the same reference numerals will refer to the same or like parts.

Figure 2:
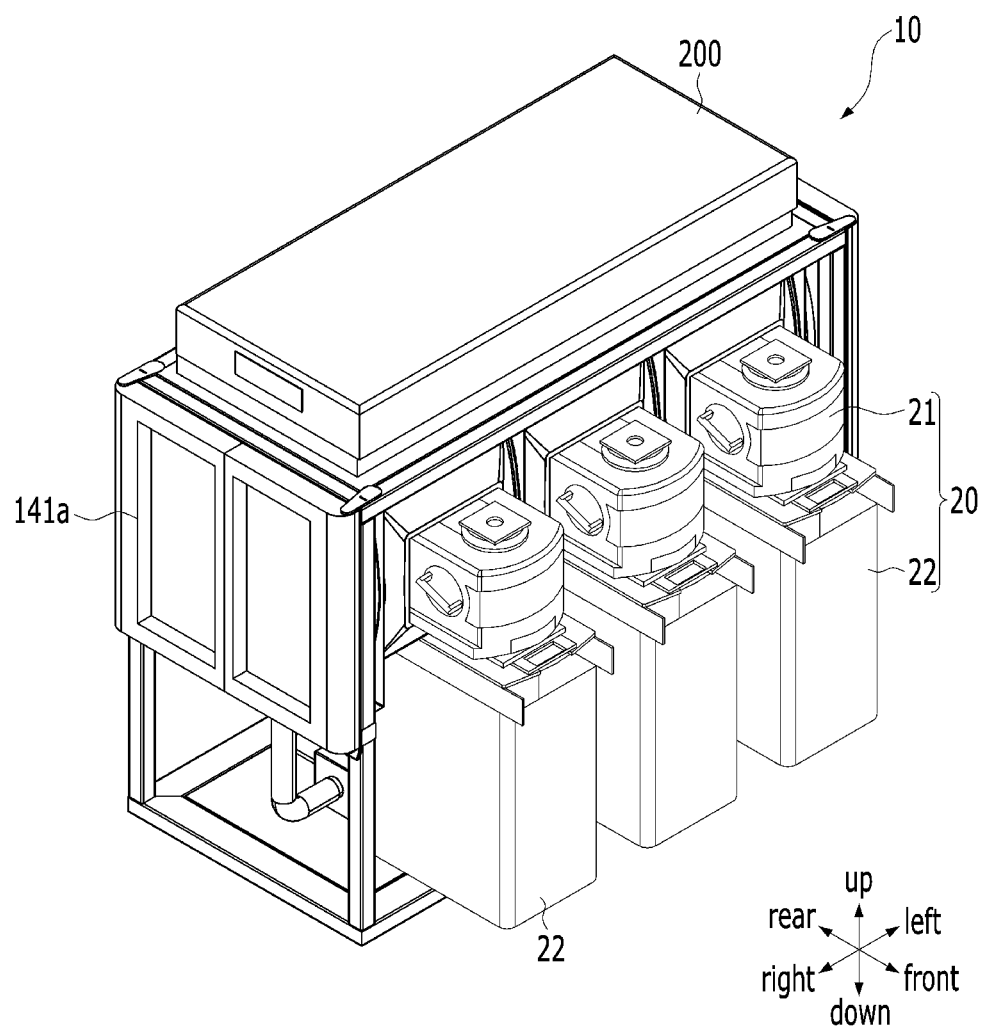
FIG. 2 is a perspective view showing a load port connected to the EFEM according to the preferred embodiment of the present invention.
Figure 3:
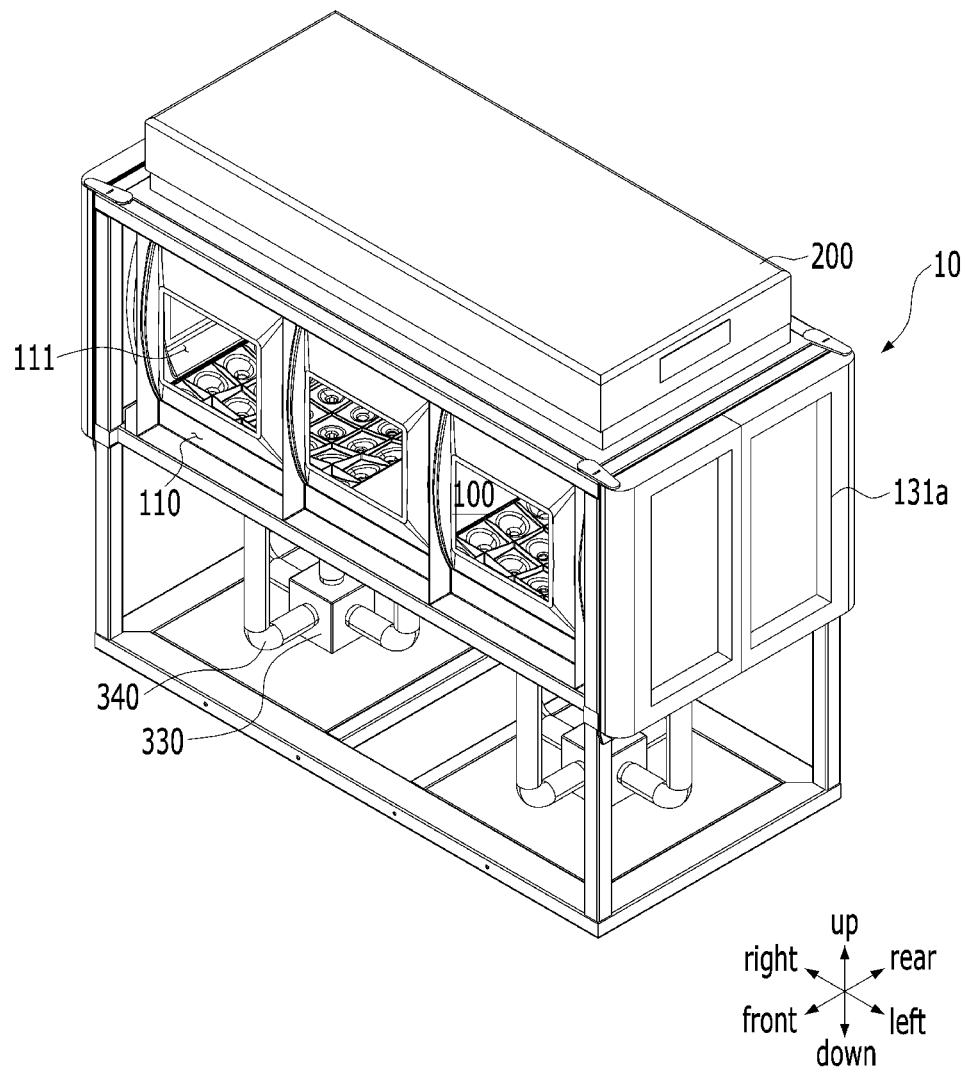
FIGS. 3 and 4 are perspective views showing the EFEM according to the preferred embodiment of the present invention.
Figure 4:
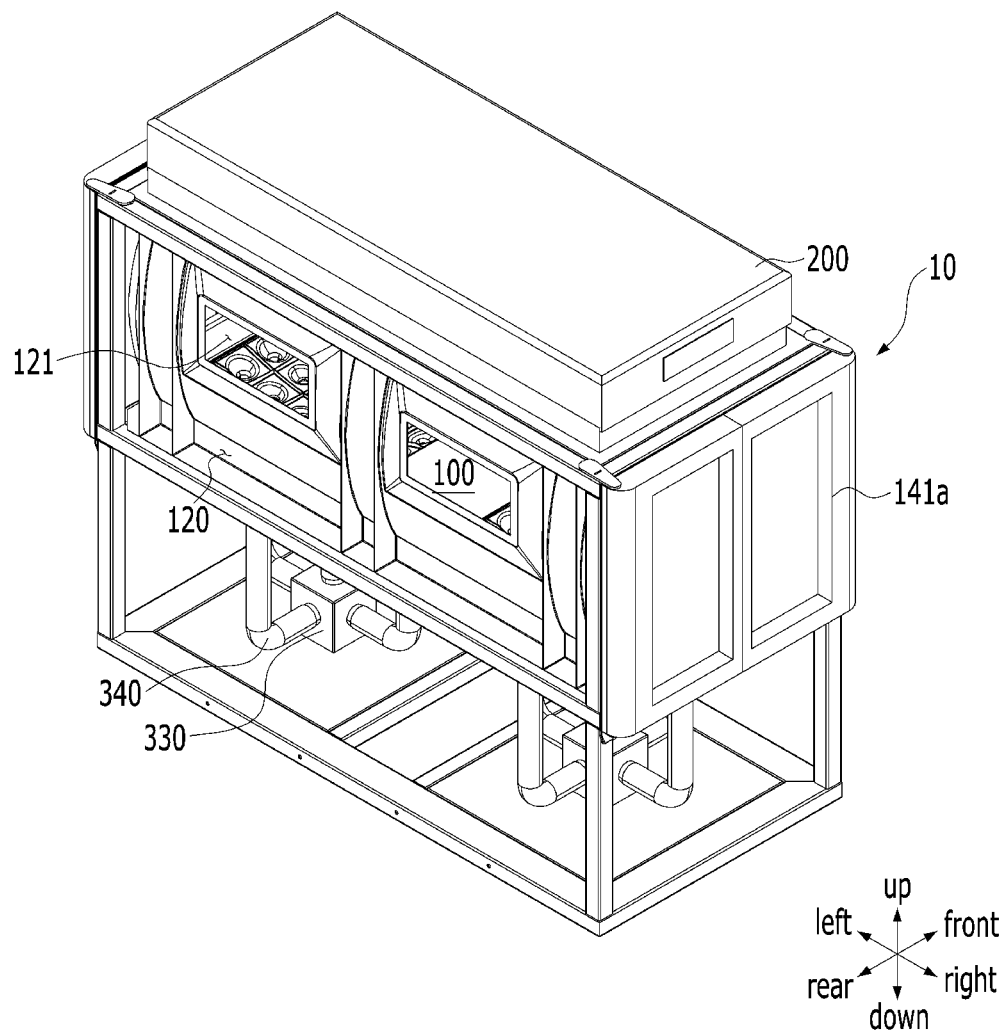
Figure 5:
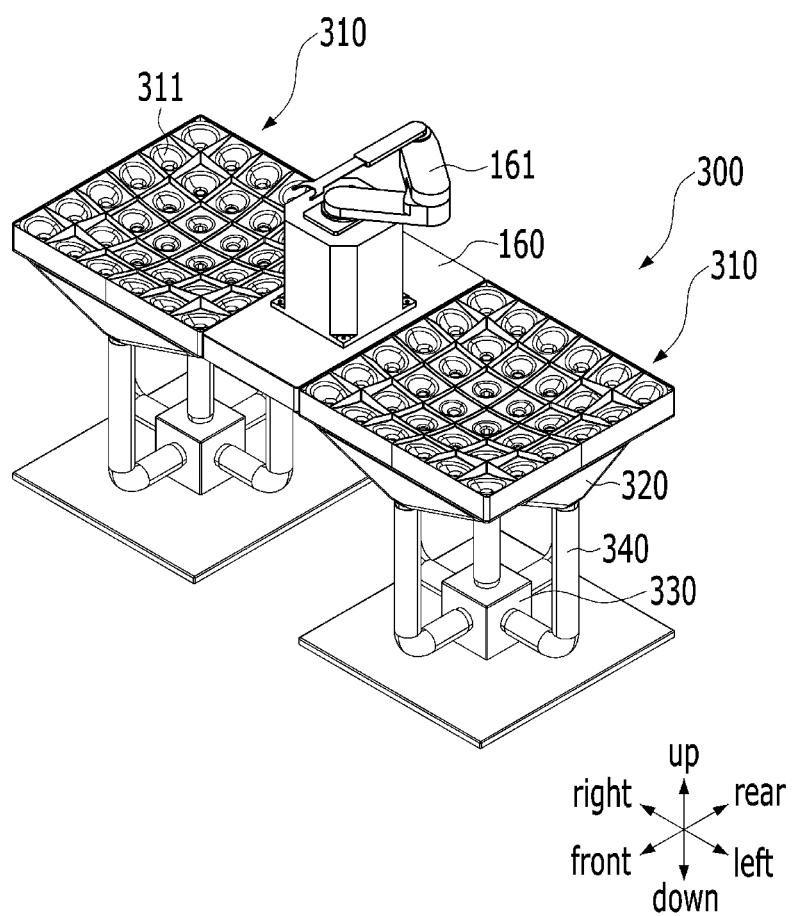
FIG. 5 is a perspective view showing an exhaust unit of FIG. 3.
Figure 6:
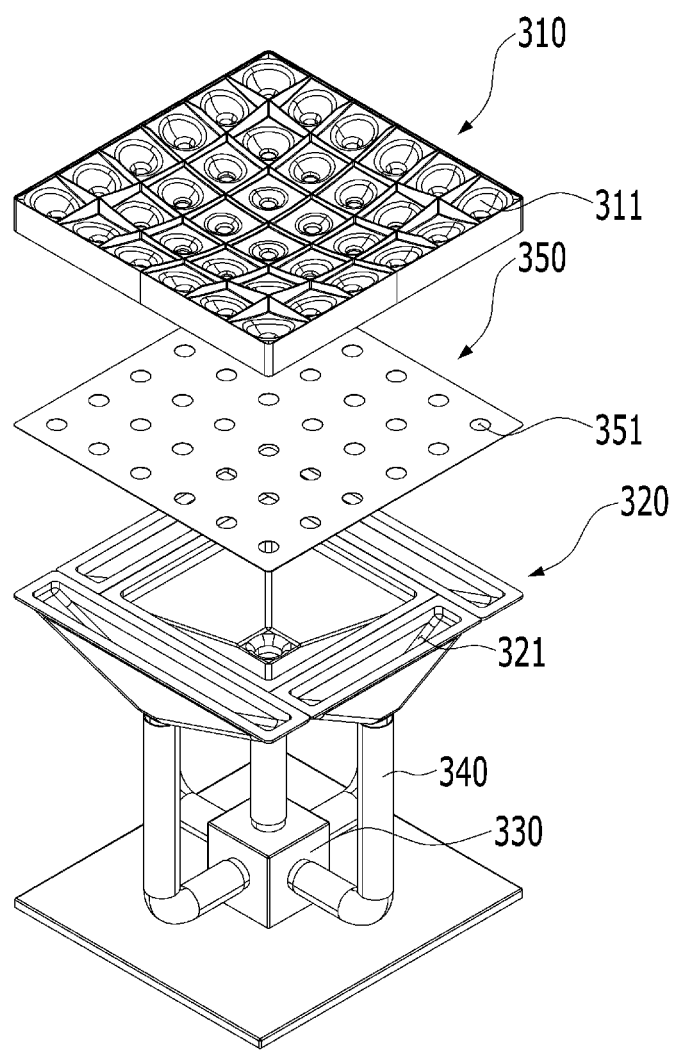
FIG. 6 is an exploded view of FIG. 5.
Figure 7A:
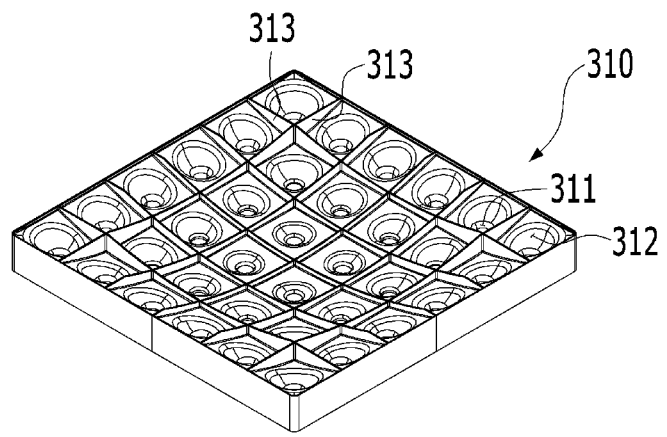
FIG. 7A is a perspective view showing an exhaust plate of FIG. 6.
Figure 7B:
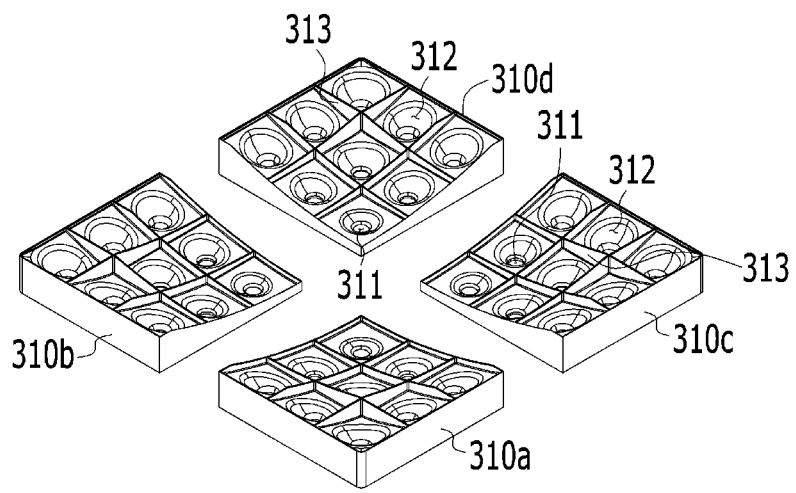
FIG. 7B is a perspective view showing that the exhaust plate of FIG. 7A is divided into first to fourth exhaust plates.
Figure 8A:
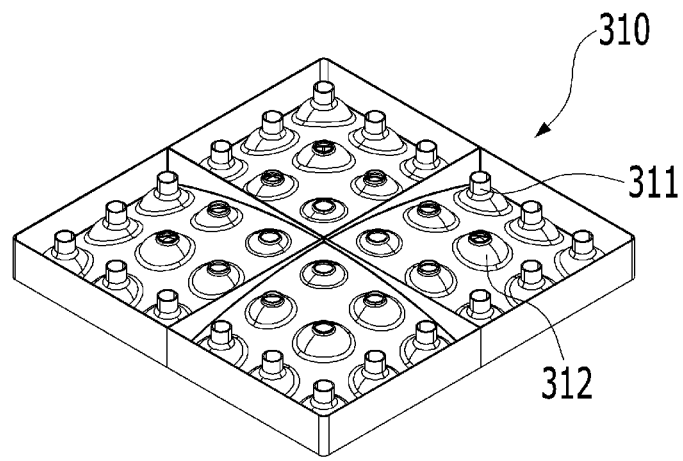
FIG. 8A is a perspective view showing a lower portion of the exhaust plate of FIG. 7A.
Figure 8B:
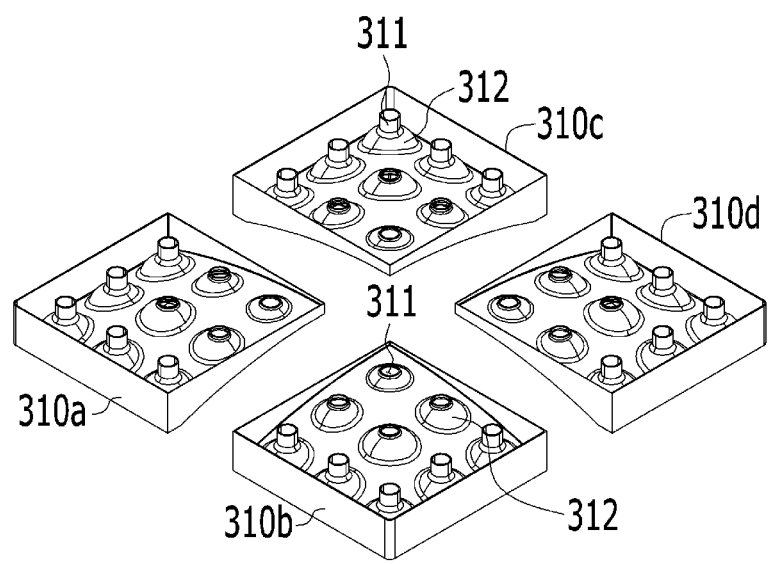
FIG. 8B is a perspective view showing lower portions of the first to fourth exhaust plates of FIG. 7B.
Figure 9:
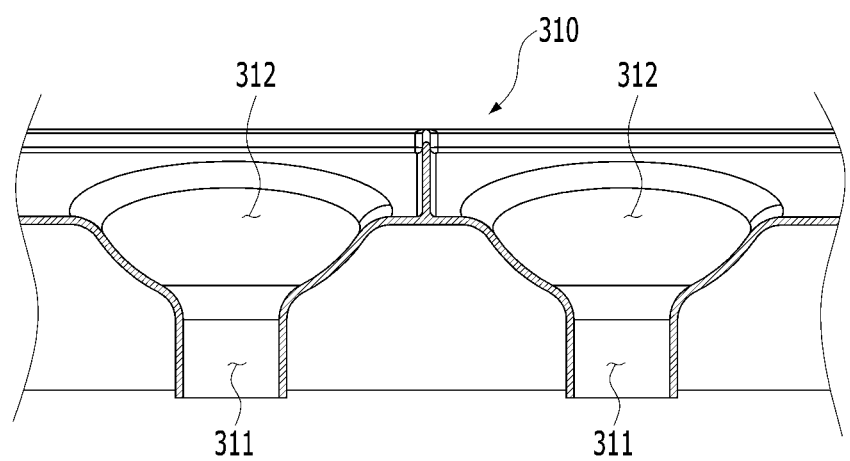
FIG. 9 is a cross-sectional view showing exhaust holes of FIG. 7A.
Figure 10:
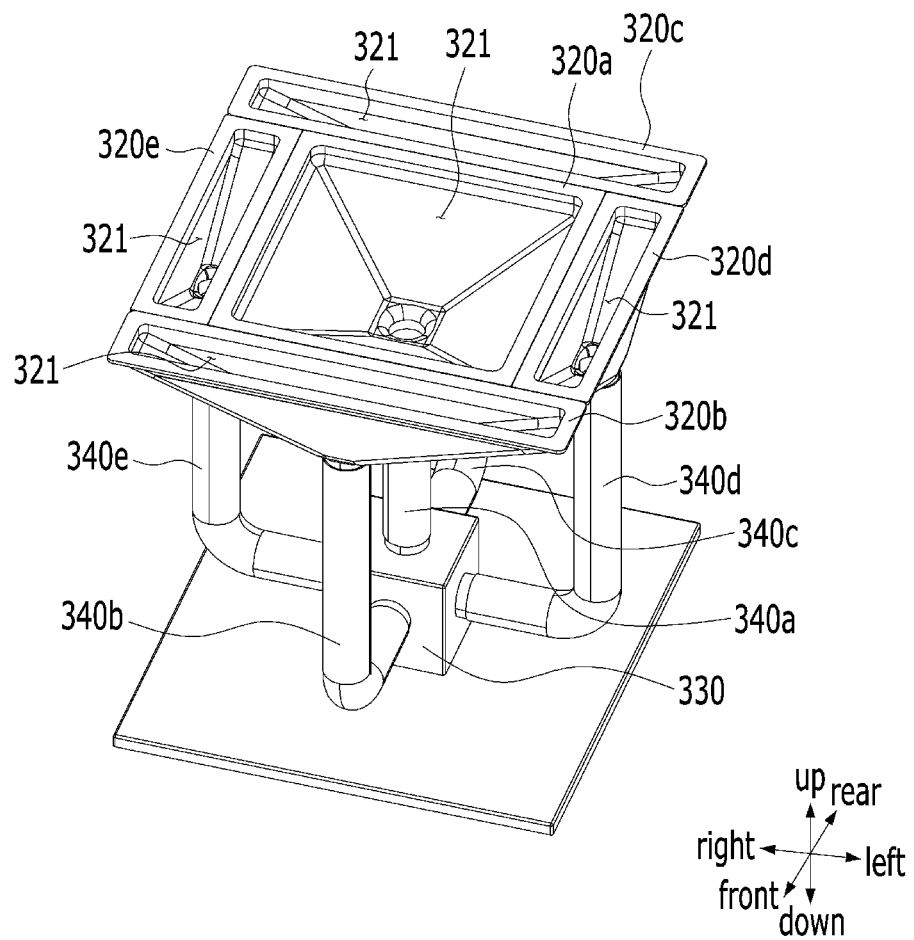
FIG. 10 is a perspective view showing a central exhaust duct, a front exhaust duct, a rear exhaust duct, a left exhaust duct, and a right exhaust duct of FIG. 5.

FIG. 1 is a plan view showing a state in which process equipment is connected to an EFEM according to a preferred embodiment of the present invention, FIG. 2 is a perspective view showing a load port connected to the EFEM according to the preferred embodiment of the present invention, FIGS. 3 and 4 are perspective views showing the EFEM according to the preferred embodiment of the present invention, FIG. 5 is a perspective view showing an exhaust unit of FIG. 3, FIG. 6 is an exploded view of FIG. 5, FIG. 7A is a perspective view showing an exhaust plate of FIG. 6, FIG. 7B is a perspective view showing that the exhaust plate of FIG. 7A is divided into first to fourth exhaust plates, FIG. 8A is a perspective view showing a lower portion of the exhaust plate of FIG. 7A, FIG. 8B is a perspective view showing lower portions of the first to fourth exhaust plates of FIG. 7B, FIG. 9 is a cross-sectional view showing exhaust holes of FIG. 7A, and FIG. 10 is a perspective view showing a central exhaust duct, a front exhaust duct, a rear exhaust duct, a left exhaust duct, and a right exhaust duct of FIG. 5.

Hereinafter, an EFEM 10 according to a preferred embodiment of the present invention will be described.

As shown in FIGS. 1 to 3, the EFEM 10 according to the preferred embodiment of the present invention includes a wafer transfer chamber 100 in which wafer transfer is performed between a wafer storage device 20 and process equipment 30, a delivery unit 200 for delivering gases into the wafer transfer chamber 100, and an exhaust unit 300 for exhausting the gases in the wafer transfer chamber 100.

The gases in the EFEM 10 denotes to all gases in the EFEM 10 including inert gas that will be described later. The inert gas denotes gas such as nitrogen, argon, etc.

A plurality of wafer storage devices 20 is arranged in connection to a front surface of the EFEM 10.

Each of the wafer storage devices 20 includes a FOUP 21 for storing wafers and a load port 22 on which the FOUP 21 is coupled and loaded.

The FOUP 21 is open at a side thereof, and a plurality of wafers is received through the open side and stored in a vertical arrangement in the FOUP 21. Accordingly, when the wafers are transported during each process in a wafer manufacturing process, the wafers can be easily transported through the FOUP 21.

The FOUP 21 is coupled and loaded on the load port 22. Accordingly, when the load port 22 is installed on the front surface of the EFEM 10, the open side of the FOUP 21 communicates with a front wall opening 111 formed in a front wall 110 of the wafer transfer chamber 100, whereby the FOUP 21 and the wafer transfer chamber 100 are connected and communicate with each other.

When the FOUP 21 and the load port 22 are coupled to each other, gases are supplied into the FOUP 21 through a gas delivery unit of the load port 22, whereby cleanliness of the wafers stored in the FOUP 21 can be managed separately.

The process equipment 30 that processes wafers is connected to a rear surface of the EFEM 10. In this case, a load lock chamber 31 of the process equipment 30 communicates with a rear wall opening 120 formed in a rear wall 120 of the wafer transfer chamber 100, whereby the process equipment 30 is connected to the rear surface of the EFEM 10.

A plurality of process equipment 30 may be connected to the rear surface of the EFEM 10, and the process equipment 30 may have various configurations.

For example, the process equipment 30 is configured such that a process equipment transfer chamber 32 is installed adjacent to the load lock chamber 31, and a plurality of process units 33 processing wafers is installed adjacent to the process equipment transfer chamber.

A load lock chamber door 31a may be provided between the load lock chamber 31 and the rear wall 120 of the wafer transfer chamber 100. By opening and closing operation of the load lock chamber door 31a, the wafer transfer chamber 100 and the load lock chamber 31 can communicate with or can block each other.

A process equipment transfer chamber door 32a may be installed between the process equipment transfer chamber 32 and each of the process units 33. By opening operation of the process equipment transfer chamber doors 32a, the process equipment transfer chamber 32 and the plurality of process units 33 can communicate with or can block each other.

The process equipment transfer chamber 32 may be provided with a process equipment transfer device 34, such that wafer transfer can be performed between the load lock chamber 31 and the plurality of process units 33 by using the process equipment transfer device 34.

Wafer Transfer Chamber 100

Hereinafter, the wafer transfer chamber 100 will be described.

As shown in FIG. 1, the wafer transfer chamber 100 functions to provide a space in which wafer transfer is performed between the wafer storage devices 20 connected to the front surface of the EFEM 10 and the process equipment 30 connected to the rear surface of the EFEM 10.

Such wafer transfer is performed by a transfer device 161 installed in the wafer transfer chamber 100.

As shown in FIGS. 2 to 4, the gas deliver unit 200 is positioned on an upper portion of the wafer transfer chamber 100.

An exhaust plate 310 of the exhaust unit 300 and an installation plate 160 on which the transfer device 161 is installed are positioned on a lower portion of the wafer transfer chamber 100, that is, the bottom of the wafer transfer chamber 100. Accordingly, a bottom surface of the wafer transfer chamber 100 is formed by the exhaust plate 310 and the installation plate 160.

The wafer transfer chamber 100 is provided with a plurality of walls forming a circumferential surface of the wafer transfer chamber 100. An opening is provided in one of the walls to which the wafer storage devices 20, the process equipment 30, or a fume removal device is connected.

Hereinafter, a case where the plurality of walls forming the circumferential surface of the wafer transfer chamber 100 includes the front wall 110, the rear wall 120, a left wall, and a right wall will be representatively described.

Furthermore, a case where the opening includes the front wall opening 111 formed in the front wall 110, the rear wall opening 121 formed in the rear wall 120, a left wall opening formed in the left wall, and a right wall opening formed in the right wall will be representatively described.

The front wall 110 is provided at a front surface of the wafer transfer chamber 100, the rear wall 120 is provided at a rear surface of the wafer transfer chamber 100, and the left and right walls are respectively provided at left and right surfaces of the wafer transfer chamber 100.

The wafer transfer chamber 100 is configured such that the circumferential surface thereof is formed by the front wall 110, the rear wall 120, the left wall, and the right wall, which are described above, and the bottom surface thereof is formed by the exhaust plate 310.

The front wall 110 is provided with the front wall opening 111 connected with the FOUP 21 of the wafer storage device 20, and the rear wall 120 is provided with the rear wall opening 121 connected with the load lock chamber 31 of the process equipment 30.

Furthermore, the left wall and the right wall are provided with the left wall opening and the right wall opening, respectively.

At least one of the wafer storage device 20, the process equipment 30, and a separate fume removal device for removing fumes on wafers may be connected to the left wall opening or the right wall opening.

In addition, a left wall door 131a and a right wall door 141a may be respectively installed on the left wall and the right wall to open and close the left wall opening and the right wall opening. In this case, a pair of left wall doors 131a and a pair of right wall doors 141a may be provided, such that both doors of the left wall doors 131a and both doors of the right wall doors 141a are opened and closed to open and close the left wall doors 131a and the right wall doors 141a.

As described above, the wafer transfer chamber 100 is provided with the front wall 110, the rear wall 120, the left wall, and the right wall, thereby having a structure in which the circumferential surface thereof is substantially closed.

Delivery Unit 200

Hereinafter, the delivery unit 200 will be described.

As shown in FIGS. 2 to 4, the delivery unit 200 is arranged on the upper portion of the wafer transfer chamber 100 and functions to deliver gases into the wafer transfer chamber 100.

The delivery unit 200 is provided with a fan filter unit (FFU).

The fan filter unit includes a blower fan and a filter arranged at a lower portion of the blower fan and functions to deliver gases filtered by the filter downward and thus deliver the gases into the wafer transfer chamber 100 to generate down flow.

In other words, the blower fan functions to deliver gases supplied from an external gas supply unit downward to thereby deliver the gases into the wafer transfer chamber 100, so that down flow is generated in the wafer transfer chamber 100 of the EFEM 10.

The filter is positioned at the lower portion of the blower fan and functions to filter foreign substances contained in gases. In this case, a HEPA filter may be used as the filter.

Exhaust Unit 300

Hereinafter, the exhaust unit 300 will be described with reference to FIGS. 5 to 10.

The exhaust unit 300 is positioned on the lower portion of the wafer transfer chamber 100 and functions to exhaust gases in the wafer transfer chamber 100.

The gases exhausted by the exhaust unit 300 include gases delivered by the delivery unit 200 and the fumes remaining on wafers.

As shown in FIGS. 5 and 6, the exhaust unit 300 includes the exhaust plate 310 forming a part of the bottom surface of the wafer transfer chamber 100 and provided with a plurality of exhaust holes 311, a communication plate 350 provided with a plurality of communication holes 351 communicating with the plurality of exhaust holes 311 of the exhaust plate 310, an exhaust duct 320 communicating with the plurality of exhaust holes 311 of the exhaust plate 310 and the plurality of communication holes 351 of the communication plate 350, and an exhaust passage 340 allowing the exhaust duct 320 and a collecting box 330 to communicate with each other.

The exhaust plate 310 forms a part of the bottom surface of the wafer transfer chamber 100 and is provided with the plurality of exhaust holes 311.

In the present invention, as shown in FIG. 5, two exhaust plates 310 are positioned in a region of the wafer transfer chamber 100 where the installation plate 160 is not installed, that is, at opposite sides of the installation plate 160, respectively. Accordingly, the bottom surface of the wafer transfer chamber 100 is formed by the installation plate 160 and the two exhaust plates 310.

An upper surface of the exhaust plate 310 has a streamlined shape being convex downwardly of the wafer transfer chamber 100. In this case, the streamlined shape is convex downwardly of the wafer transfer chamber 100 based on the center of the exhaust plate 310.

In other words, the upper surface of the exhaust plate 310 has a shape being gradually convex from the periphery to the center downwardly of the wafer transfer chamber 100, thereby having a shape being gradually concave from the periphery to the center of the exhaust plate 310.

Due to the upper surface shape of the exhaust plate 310 described above, gases and fumes delivered from the delivery unit 200 can efficiently flow to the exhaust holes 311 of the exhaust plate 310. Thus, unlike an EFEM in the related art, it is possible to prevent harmful substances such as fumes, etc. from accumulating and remaining on the upper surface of the exhaust plate 310.

Furthermore, the upper surface shape of the exhaust plate 310 has a streamlined shape, whereby it is possible to effectively prevent a vortex from being generated when gases delivered from the delivery unit 200 is exhausted to the exhaust plate 310. Thus, the down flow formed when the gases delivered from the delivery unit 200 flow from the delivery unit 200 to the exhaust plate 310 can be a laminar flow rather than turbulent flow, whereby delivery and exhaust of the gases in the wafer transfer chamber 100 can be efficiently maintained.

The exhaust plate 310 is provided with the plurality of exhaust holes 311 and each of the plurality of exhaust holes 311 is provided with an inclined portion 312 as shown in FIGS. 7A and 9.

A plurality of inclined portions 312 communicate with upper portions of the plurality of exhaust holes 311, respectively.

The plurality of inclined portions 312 are configured such that a diameter thereof gradually decreases downwardly of the exhaust plate 310 and have a streamlined shape being convex downwardly of the exhaust plate 310. Due to this structure of the inclined portions 312, gases in the wafer transfer chamber 100 can be easily guided to flow to the exhaust holes 311, whereby harmful substances such as fumes, etc. are prevented from remaining on the exhaust plate 310.

The exhaust plate 310 is provided with a partition wall 313 for partitioning the plurality of exhaust holes 311 such that each exhaust hole 311 is separated from another.

The partition wall 313 functions to guide down flow in the wafer transfer chamber 100, that is, gases in the wafer transfer chamber 100, to the respective exhaust holes 311.

A plurality of partition walls 313 are provided between the plurality of exhaust holes 311 in front, rear, left, and right directions, respectively. Accordingly, the respective exhaust holes 311 are surrounded by the partition walls 313, whereby the respective exhaust holes 311, that is, each exhaust hole 311 can be individually separated from another.

An upper portion of the partition wall 313 has a streamlined shape being convex downwardly of the wafer transfer chamber so as to correspond to the streamlined shape of the exhaust plate 310.

As such, the partition wall 313 also has a streamlined shape, so that both an upper portion of the exhaust plate 310, that is, the upper surface of the exhaust plate 310, and the upper portion of the partition wall 313 can maintain a streamlined shape overall.

The plurality of exhaust holes 311 are individually partitioned by the partition walls 313, whereby down flow in the wafer transfer chamber 100 can be guided to efficiently flow to the respective exhaust holes 311.

The exhaust plate 310 may be composed of a plurality of exhaust plates 310 combined together. In an embodiment of the present invention, as shown in FIGS. 7B and 8B, the exhaust plate 310 is composed of first to fourth exhaust plates 310a, 310b, 310c, and 310d.

As such, the exhaust plate 310 is composed of the first to fourth exhaust plates 310a, 310b, 310c, and 310d, whereby the exhaust plate 310 having a streamlined shape can be easy to manufacture. In addition, in a case where any one of the first to fourth exhaust plates 310a, 310b, 310c, and 310d is damaged due to long-term use of the EFEM 10, replacing only the damaged exhaust plate is required, which is advantageous in terms of maintenance.

As described above, the upper surface of the exhaust plate 310 has a streamlined shape, so that as shown in FIGS. 8A and 8B, the height of the first electrode 311 may vary depending on the position of the exhaust holes 311.

In other words, the exhaust holes 311 positioned in the lowest region of the upper surface of the exhaust plate 310, that is, in the most concave central region have the lowest height, while the exhaust holes 311 positioned in the highest region of the upper surface of the exhaust plate 310, that is, in the non-concave periphery have the highest height.

As such, by varying the height of the exhaust holes 311, all the exhaust holes 311 can efficiently communicate with the plurality of communication holes 351 of the communication plate 350, respectively, regardless of the position of the plurality of exhaust holes 311.

The communication plate 350 is interposed between the exhaust plate 310 and the exhaust duct 320 and provided with the plurality of communication holes 351 passing through upper and lower surfaces of the communication plate 350 at positions corresponding to the plurality of exhaust holes 311.

The plurality of communication holes 351 are formed in the same number as the plurality of exhaust holes 311 and serve to allow the plurality of exhaust holes 311 and the exhaust duct 320 to communicate with each other.

The communication plate 350 is interposed between the exhaust plate 310 and the exhaust duct 320, so that the exhaust holes 311 of the exhaust plate 310 are prevented from being inserted into an exhaust duct hole 321 of the exhaust duct 320 whereby the exhaust plate 310 can be easily arranged on an upper portion of the exhaust duct 320. In other words, the communication plate 350 functions to help alignment of the exhaust plate 310 with the exhaust duct 320.

The exhaust duct 320 is positioned at a lower portion of the communication plate 350 and provided with the exhaust duct hole 321 formed at a center of the exhaust duct 320.

The exhaust duct hole 321 of the exhaust duct 320 communicates with both the plurality of exhaust holes 311 and the plurality of communication holes 351.

In this case, an opening area of the exhaust duct hole 321 is larger than an opening area of the exhaust holes 311, whereby the plurality of exhaust holes 311 can communicate with one exhaust duct hole 321.

The exhaust duct hole 321 may have a shape being gradually convex from the periphery to the center of the exhaust duct 320 downwardly of the wafer transfer chamber 100. Thus, gases having flowed into the exhaust duct hole 321 can efficiently flow into the exhaust passage 340.

A plurality of exhaust ducts 320 may be provided such that an exhaust region of the exhaust holes 311 of the exhaust plate 310 are divided into a plurality of exhaust regions and thus exhaust is performed.

As an embodiment of the present invention, as shown in FIG. 10, the exhaust ducts 320 is composed of five exhaust ducts 320, that is, a central exhaust duct 320a, a front exhaust duct 320b, a rear exhaust duct 320c, a left exhaust duct 320d, and a right exhaust duct 320e.

In this case, the front exhaust duct 320b, the rear exhaust duct 320c, the left exhaust duct 320d, and the right exhaust duct 320e are arranged so as to surround the central exhaust duct 320a. Accordingly, the front exhaust duct 320b, the rear exhaust duct 320c, the left exhaust duct 320d, and the right exhaust duct 320e are positioned around the central exhaust duct 320a.

An exhaust duct hole 321 of the central exhaust duct 320a communicates with the exhaust holes of the plurality of exhaust holes 311 positioned in a central region of the exhaust plate 310. Accordingly, some gas in the wafer transfer chamber 100 which flows into the central region of the exhaust plate 310 flows into the collecting box 330 through the central exhaust duct 320a and is then exhausted.

An exhaust duct hole 321 of the front exhaust duct 320b communicates with the exhaust holes of the plurality of exhaust holes 311 positioned in a front region of the exhaust plate 310. Accordingly, some gas in the wafer transfer chamber 100 which flows into the front region of the exhaust plate 310 flows into the collecting box 330 through the front exhaust duct 320b and is then exhausted.

An exhaust duct hole 321 of the rear exhaust duct 320c communicates with the exhaust holes of the plurality of exhaust holes 311 positioned in a rear region of the exhaust plate 310. Accordingly, some gas in the wafer transfer chamber 100 which flows into the rear region of the exhaust plate 310 flows into the collecting box 330 through the rear exhaust duct 320c and is then exhausted.

An exhaust duct hole 321 of the left exhaust duct 320d communicates with the exhaust holes of the plurality of exhaust holes 311 positioned in a left region of the exhaust plate 310. Accordingly, some gas in the wafer transfer chamber 100 which flows into the rear region of the exhaust plate 310 flows into the collecting box 330 through the left exhaust duct 320d and is then exhausted.

An exhaust duct hole 321 of the right exhaust duct 320e communicates with the exhaust holes of the plurality of exhaust holes 311 positioned in a right region of the exhaust plate 310. Accordingly, some gas in the wafer transfer chamber 100 which flows into the rear region of the exhaust plate 310 flows into the collecting box 330 through the right exhaust duct 320e and is then exhausted.

Each of the exhaust duct holes 321 of the central exhaust duct 320a, the front exhaust duct 320b, the rear exhaust duct 320c, the left exhaust duct 320d, and the right exhaust duct 320e has a shape being convex downward such that gas collection can be efficiently performed. Accordingly, gases in the wafer transfer chamber 100 can efficiently flow through the exhaust duct holes 321 to a plurality of first to fifth exhaust passages 340a, 340b, 340c, 340d, and 340e that will be described below.

The exhaust passage 340 serves to allow the exhaust duct 320 to communicate with the collecting box 330.

The exhaust passage 340 may include the first exhaust passage 340a allowing the central exhaust duct 320a and the collecting box 330 to communicate with each other, the second exhaust passage 340b allowing the front exhaust duct 320b and the collecting box 330 to communicate with each other, the third exhaust passage 340c allowing the rear exhaust duct 320c and the collecting box 330 to communicate with each other, the fourth exhaust passage 340d allowing the left exhaust duct 320d and the collecting box 330 to communicate with each other, and the fifth exhaust passage 340e allowing the right exhaust duct 320e and the collecting box 330 to communicate with each other.

The collecting box 330 communicates with the exhaust passage 340, that is, the first to fifth exhaust passages 340a, 340b, 340c, 340d and 340e, and functions to allow gases in the wafer transfer chamber 100 having flowed through the first to fifth exhaust passages 340a, 340b, 340c, 340d and 340e to be collected finally and exhausted to an external exhaust unit.

Due to the collecting box 330 having the above-described configuration, gases in the wafer transfer chamber 100 of the EFEM 10 can be efficiently exhausted to a single external exhaust unit.

Due to the exhaust plate 310, the exhaust duct 320, the exhaust passage 340, and the collecting box 330 of the exhaust unit 300 having the above-described configurations, an exhaust region of the exhaust plate 310 can be divided into a plurality of exhaust regions. Thus, it is possible to effectively prevent generation of a dead region where no exhaust is performed.

Accordingly, gases in the wafer transfer chamber 100 can be efficiently exhausted, whereby it is possible to prevent harmful substances such as fumes, etc. from remaining in the wafer transfer chamber 100.

In addition, due to the above-described configurations, exhaust through the exhaust plate 310 can be performed for each region, and further, an opening/closing device such as an opening/closing valve, etc. may be installed on the plurality of exhaust ducts 320 or the plurality of exhaust passages 340, thus easily achieving individual exhaust control such that exhaust is performed only in a desired exhaust region.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. An equipment front end module (EFEM), the EFEM comprising:
   a wafer transfer chamber in which wafer transfer is performed between a wafer storage device and process equipment;
   a delivery unit delivering gases into the wafer transfer chamber; and
   an exhaust unit exhausting the gases in the wafer transfer chamber,
   wherein the exhaust unit includes an exhaust plate provided with a plurality of exhaust holes, and an upper surface of the exhaust plate has a streamlined shape being convex downwardly of the wafer transfer chamber.

2. The EFEM of claim 1, wherein the streamlined shape is convex downwardly of the wafer transfer chamber based on a center of the exhaust plate.

3. The EFEM of claim 1, wherein the exhaust plate is provided with a plurality of inclined portions each communicating with an upper portion of each of the plurality of the exhaust holes, and
   the plurality of inclined portions are configured such that a diameter thereof gradually decreases downwardly of the exhaust plate and have a streamlined shape being convex downwardly of the exhaust plate.

4. The EFEM of claim 1, wherein the exhaust plate is provided with a partition wall partitioning the plurality of exhaust holes such that each exhaust hole is separated from another.

5. The EFEM of claim 4, wherein an upper portion of the partition wall has a streamlined shape being convex downwardly of the wafer transfer chamber.

6. The EFEM of claim 1, wherein the exhaust unit further includes:
   an exhaust duct arranged at a lower portion of the exhaust plate and communicating with the plurality of exhaust holes, and
   the exhaust duct is provided in plural and divides an exhaust region of the exhaust plate into a plurality of exhaust regions.

7. The EFEM of claim 6, wherein the plurality of exhaust ducts is composed of: a central exhaust duct communicating with the exhaust holes of the plurality of exhaust holes positioned in a central region of the exhaust plate; a front exhaust duct communicating with the exhaust holes of the plurality of exhaust holes positioned in a front region of the exhaust plate; a rear exhaust duct communicating with the exhaust holes of the plurality of exhaust holes positioned in a rear region of the exhaust plate; a left exhaust duct communicating with the exhaust holes of the plurality of exhaust holes positioned in a left region of the exhaust plate; and a right exhaust duct communicating with the exhaust holes of the plurality of exhaust holes positioned in a right region of the exhaust plate, and
   the front, rear, left, and right exhaust ducts are positioned around the central exhaust duct.

8. The EFEM of claim 7, wherein the exhaust unit further includes:
   a collecting box communicating with the central, front, rear, left, and right exhaust ducts.

* * * * *